US 6,661,852 B1
Dec. 9, 2003

(54) APPARATUS AND METHOD FOR QUADRATURE TUNER ERROR CORRECTION

(75) Inventor: Thad J. Genrich, Aurora, CO (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/358,354

(22) Filed: Jul. 21, 1999

(51) Int. Cl.[7] .................. H04L 27/14; H04L 27/16; H04L 27/22
(52) U.S. Cl. .................. 375/326; 375/344; 375/345
(58) Field of Search .................. 375/326, 327, 375/344, 345, 375, 376; 455/136, 138, 139, 182.2, 182.3, 164.1

(56) References Cited

U.S. PATENT DOCUMENTS

| | | | |
|---|---|---|---|
| 3,969,615 A | 7/1976 | Bowers et al. | 235/151.11 |
| 4,077,063 A | 2/1978 | Lind | 364/729 |
| 4,486,846 A | 12/1984 | McCallister et al. | 364/607 |
| 4,787,058 A | 11/1988 | Schmars | 364/807 |
| 4,809,205 A | 2/1989 | Freeman | 364/721 |
| 4,926,443 A | 5/1990 | Reich | 375/102 |

(List continued on next page.)

FOREIGN PATENT DOCUMENTS

| | | | | |
|---|---|---|---|---|
| DE | 196 16 368 C1 | * | 11/1997 | H03D/3/02 |
| DE | 196 16 368 C1 | | 12/1997 | H03D/3/02 |
| EP | 0 102 784 A2 | | 3/1984 | G06F/1/02 |
| EP | 0 392 229 A2 | | 10/1990 | H04L/25/06 |
| EP | 0 889 595 A1 | | 6/1998 | H03L/7/18 |
| EP | 0 926 857 A2 | | 6/1999 | H04L/7/02 |
| GB | 2152715 A | | 8/1985 | G06F/7/548 |
| WO | WO 86/06517 | | 11/1986 | G06F/1/02 |
| WO | WO 92/02872 | | 2/1992 | G06F/1/035 |
| WO | WO 99/23760 | | 5/1999 | H04B/1/16 |
| WO | WO 99/49582 | | 9/1999 | H04B/1/10 |

OTHER PUBLICATIONS

PCT International Search Report dated Nov. 10, 2000, for PCT/US 00/20060 filed Jul. 21, 2000.

(List continued on next page.)

Primary Examiner—Mohammad H. Ghayour
(74) Attorney, Agent, or Firm—Baker Botts L.L.P.

(57) ABSTRACT

An apparatus for quadrature tuner error correction includes an offset correction circuit adapted to receive a digital in-phase signal and a digital quadrature signal from a quadrature tuner. The offset correction circuit has an in-phase circuit comprising a summer adapted to receive the digital in-phase signal, subtract an in-phase offset estimate therefrom, and generate an offset corrected in-phase signal, and a feedback loop adapted to integrate the offset corrected in-phase signal, multiply the integrated offset corrected in-phase signal by a first adjustable constant, and generate the in-phase offset estimate. The offset correction circuit has a quadrature circuit comprising a summer adapted to receive the digital quadrature signal, substract a quadrature offset estimate therefrom, and generate an offset corrected quadrature signal, and a feedback loop adapted to integrate the offset corrected quadrature signal, multiply the integrated offset corrected quadrature signal by a second adjustable constant, and generate the quadrature offset estimate.

36 Claims, 3 Drawing Sheets

U.S. PATENT DOCUMENTS

| | | | |
|---|---|---|---|
| 4,975,699 A | 12/1990 | Frey | 341/118 |
| 5,027,087 A | 6/1991 | Rottinghaus | 332/127 |
| 5,111,162 A | 5/1992 | Hietala et al. | 332/127 |
| 5,146,418 A | 9/1992 | Lind | 364/729 |
| 5,204,676 A | 4/1993 | Herrmann | 341/61 |
| 5,249,204 A | 9/1993 | Funderburk et al. | 375/97 |
| 5,276,633 A | 1/1994 | Fox et al. | 364/721 |
| 5,315,620 A | 5/1994 | Halawani et al. | 375/102 |
| 5,483,203 A | 1/1996 | Rottinghaus | 331/10 |
| 5,504,751 A | 4/1996 | Ledzius et al. | 370/100.1 |
| 5,517,529 A | 5/1996 | Stehlik | 375/316 |
| 5,596,609 A | 1/1997 | Genrich et al. | 375/350 |
| 5,697,068 A | 12/1997 | Salvi et al. | 455/76 |
| 5,790,601 A | 8/1998 | Corrigan, III et al. | 375/302 |
| 5,812,940 A | 9/1998 | Lindell | 455/114 |
| 5,815,117 A | 9/1998 | Kolanek | 342/442 |
| 5,894,592 A | 4/1999 | Brueske et al. | 455/86 |
| 5,991,605 A | 11/1999 | Rapeli | 455/76 |
| 6,028,493 A | 2/2000 | Olgaard et al. | 332/103 |
| 6,055,280 A | 4/2000 | Genrich | 375/325 |
| 6,133,804 A | 10/2000 | Wagner et al. | 332/127 |
| 6,298,093 B1 | 10/2001 | Genrich | 375/271 |
| 6,366,225 B1 | 4/2002 | Ozdemir | 341/111 |

OTHER PUBLICATIONS

"Method and System for Generating a Trigonometric Function", Specification, Claims and Abstract (30 pages), 2 pages of drawings, inventor Thad J. Genrich, filed Jul. 27, 1999, U.S. Appln. Ser. No. 09/361,917.

Gardner, F.M., "Interpolation in Digital Modems/Part I: Fundamentals", IEEE Transactions on Communications, IEEE Inc., New York, vol. 41, No. 3, Mar. 1, 1993 (pp. 501–507), XP000372693.

"Digital Tuner with Optimized Clock Frequency and Integrated Parallel CIC Filter and Local Oscillator", Specification, Claims and Abstract (22 pages), drawings (3 pages), Application Ser. No. 09/527,798 filed Mar. 17, 2000, inventor Thad J. Genrich.

"Parallel Asynchronous Sample Rate Reducer", Specification, Claims and Abstract (24 pages), drawings (6 pages), Application Ser. No. 09/527,411 filed Mar. 17, 2000, inventor Thad J. Genrich.

International Search Report dated Oct. 23, 2001 for PCT/US 01/08478 filed Mar. 15, 2001.

Aschwanden, Felix, "Direct Conversion—How to Make it Work in TV Tuners," IEEE Transactions on Consumer Electronics, US, IEEE Inc. New York, vol. 42, No. 3. Aug. 1, 1996, pp. 729–738, XP 000638561.

PCT International Search Report dated Nov. 10, 2000 for PCT/US 00/20060 filed Jul. 21, 2000.

PCT International Search Report dated Nov. 15, 2000 for PCT/US 00/21016 filed Aug. 1, 2000.

Hogenauer, Eugene B., Manuscript: "An Economical Class of Digital Filters for Decimation and Interpolation", IEEE Transactions on Acoustics, Speech and Signal Processing, vol. ASSP–29, Number 2, Apr. 1981, 9 pages.

* cited by examiner

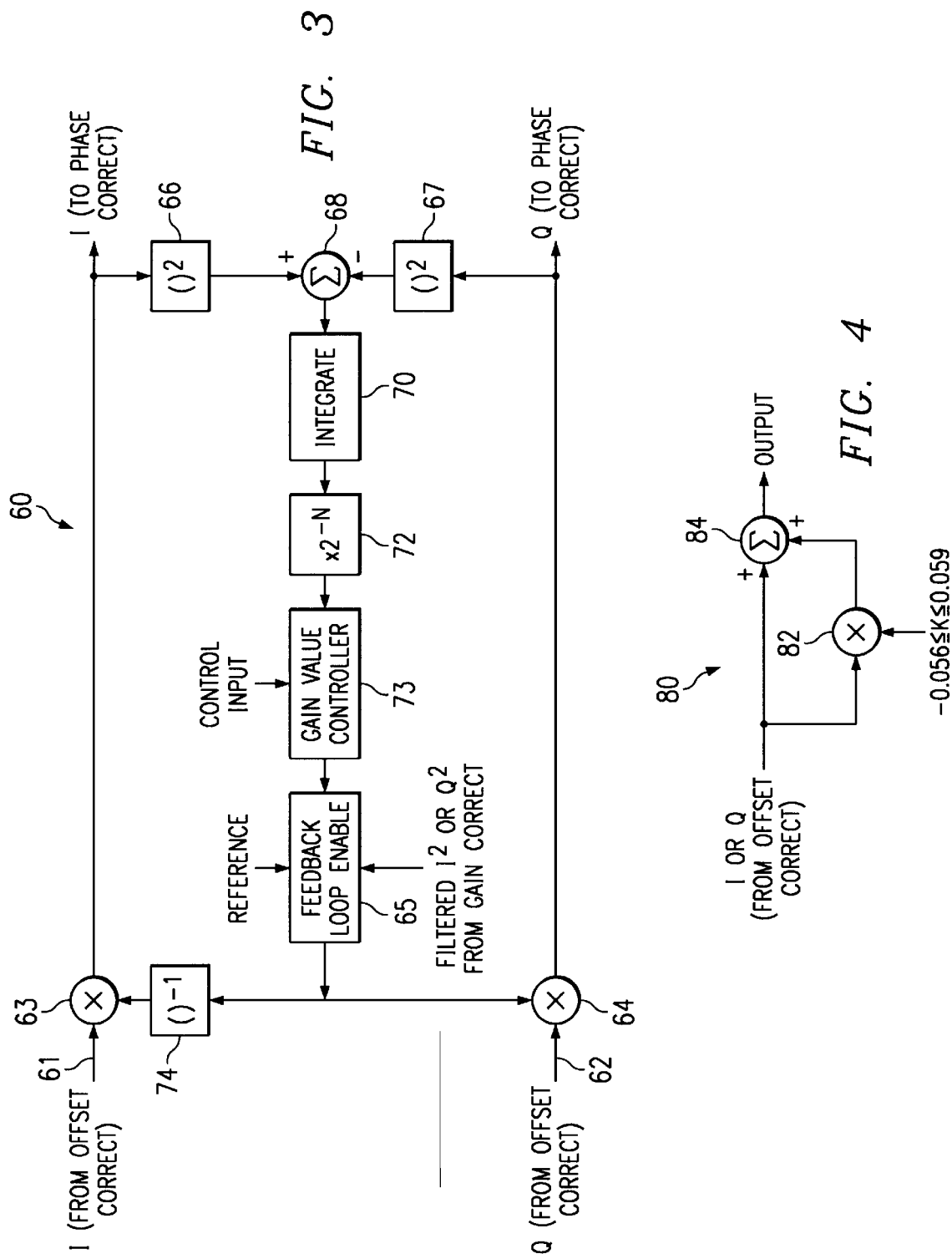

APPARATUS AND METHOD FOR QUADRATURE TUNER ERROR CORRECTION

TECHNICAL FIELD OF THE INVENTION

This invention is related in general to the field of electrical and electronic circuits. More particularly, the invention is related to apparatus and a method for quadrature tuner error correction.

BACKGROUND OF THE INVENTION

A block diagram of an ideal quadrature tuner 10 and digitizer 12 is shown in FIG. 1. An unmodulated input carrier signal 14 is represented by $A \cos(\omega_C t+\theta)$. Unmodulated input carrier signal 14 has a peak amplitude A, radian frequency $\omega_C$, and an arbitrary phase of $\theta$ radians. Input carrier signal 14 is mixed by mixers 16 and 17 with two signals 18 and 19 generated by a local oscillator (LO) 20. Signals 18 and 19 are represented by $\cos(\omega_{LO} t)$ and $-\sin(\omega_{LO} t)$, which both have a normalized amplitude of 1, radian frequency $\omega_{LO}$, and normalized phase of 0 radians. The resulting signals are:

$$A\cos(\omega_C t+\theta)\cos(\omega_{LO} t)=(A/2)\cos[(\omega_C-\omega_{LO})t+\theta]+(A/2)\cos[(\omega_C+\omega_{LO})t+\theta]$$

and $$-A\cos(\omega_C t+\theta)\sin(\omega_{LO} t)=(A/2)\sin[(\omega_C-\omega_{LO})t+\theta]-(A/2)\sin[(\omega_C+\omega_{LO})t+\theta] \quad (1)$$

Ideal lowpass filters (LPFs) 24 and 25 receive these resultant signals and remove only the high frequency components, resulting in analog in-phase (I) and quadrature (Q) signals 26 and 27:

$$I=(A/2)\cos[(\omega_C-\omega_{LO})t+\theta]$$

and $$Q=(A/2)\sin[(\omega_C-\omega_{LO})t+\theta] \quad (2)$$

Analog in-phase and quadrature signals 26 and 27 are converted to digital form by analog-to-digital converters (ADC) 28 and 29 for further processing.

On the other hand, a real quadrature tuner produces offset, gain, and phase errors which reduce the accuracy of the resulting in-phase and quadrature signals. The worst case gain and phase errors of several commercially available tuner devices are in the ±0.5 dB and ±5.0° range, respectively.

Conventional attempts to correct these errors may use. analog trimming, adjustments, or calibration. These methods are undesirable due to high cost. Another conventional method uses analog-to-digital converters with wide bandwidths and high speed to digitize the in-phase and quadrature output signals. The requirement of high performance analog-to-digital converters adds substantially to cost and the complexity of the circuit.

SUMMARY OF THE INVENTION

Accordingly, there is a need for a circuit and method that efficiently correct quadrature tuner offset, gain, and phase errors. In accordance with the present invention, apparatus and a method of quadrature tuner error correction are provided which eliminate or substantially reduce the disadvantages associated with prior circuits or algorithms.

In one aspect of the invention, apparatus for quadrature tuner error correction includes an offset correction portion adapted to receive a digital in-phase signal and a digital quadrature signal from a quadrature tuner. The offset correction portion has an in-phase portion comprising a summer adapted to receive the digital in-phase signal, subtract an in-phase offset estimate therefrom, and generate an offset corrected in-phase signal, and a feedback loop adapted to integrate the offset corrected in-phase signal, multiply the integrated offset corrected in-phase signal by a first adjustable constant, and generate the in-phase offset estimate. The offset correction portion has a quadrature portion comprising a summer adapted to receive the digital quadrature signal, substract a quadrature offset estimate therefrom, and generate an offset corrected quadrature signal, and a feedback loop adapted to integrate the offset corrected quadrature signal, multiply the integrated offset corrected quadrature signal by a second adjustable constant, and generate the quadrature offset estimate.

In another aspect of the invention, a method of correcting errors in a quadrature tuner includes an offset correction process which receives a digital in-phase signal and a digital quadrature signal from the quadrature tuner. The offset correction process has an in-phase portion which includes the steps of receiving the digital in-phase signal, subtracting an in-phase offset estimate therefrom, and generating an offset corrected in-phase signal, and feeding back the offset corrected in-phase signal through a first feedback loop, the feedback loop integrating the offset corrected in-phase signal, multiplying the integrated offset corrected in-phase signal by a first adjustable constant, and generating the in-phase offset estimate. The offset correction process also has a quadrature portion with the steps of receiving the digital quadrature signal, subtracting a quadrature offset estimate therefrom, and generating an offset corrected quadrature signal, and feeding back the offset corrected quadrature signal through a feedback loop, the feedback loop integrating the offset corrected quadrature signal, multiplying the integrated offset corrected quadrature signal by a second adjustable constant, and generating the quadrature offset estimate.

In yet another aspect of the invention, apparatus for quadrature tuner error correction includes an offset correction portion adapted to receive a digital in-phase signal and a digital quadrature signal from a quadrature tuner and generating offset corrected in-phase and quadrature signals, a gain correction portion coupled to the offset correction portion adapted to receive the offset corrected in-phase and quadrature signals and generating offset and gain corrected in-phase and quadrature signals, and a phase correction portion coupled to the gain correction portion adapted to receive the gain corrected in-phase and quadrature signals and generating offset, gain and phase corrected in-phase and quadrature signals.

BRIEF DESCRIPTION OF THE DRAWINGS

For a better understanding of the present invention, reference may be made to the accompanying drawings, in which:

FIG. 3 is a functional block diagram of an embodiment of a gain correction circuit and algorithm constructed according to an embodiment of the present invention;

FIG. 4 is a functional block diagram of an embodiment of a gain control multiplier constructed according to an embodiment of the present invention.

DETAILED DESCRIPTION OF THE INVENTION

The in-phase and quadrature offset errors produced by a real quadrature tuner may be represented by adding $O_I$ and $O_Q$, to the respective output signals. The offset errors are DC signals typically in the range of ±10 millivolts. The offsets are not necessarily matched, and may vary as a function of operating temperature.

The gain error may be represented by multiplying the respective in-phase and quadrature signals by constants $G_I$ and $G_Q$. Gain mismatch can be expressed in dB using the equation:

$$\text{Gain mismatch (db)} = 20 \log 10 \, (G_I/G_Q) \quad (3)$$

Gain mismatch is typically in the range of ±1 dB, and may vary as a function of operating temperature.

A phase error of $\phi$ radians can be represented by adding half of its value to the phase of the in-phase output signal, and subtracting half of its value from the phase of the quadrature output signal.

Therefore, the equations which represent the in-phase and quadrature outputs with offset, gain and phase error sources are:

$$I = O_I + G_I(A/2)\cos[(\omega_C - \omega_{LO})t + \theta + \phi/2]$$

$$Q = O_Q + G_Q(A/2)\sin[(\omega_C - \omega_{LO})t + \theta - \phi/2] \quad (4)$$

Combining the gain and amplitude terms and normalizing results in:

$$I = O_I + A_I \cos[(\omega_C - \omega_{LO})t + \theta + \phi/2]$$

$$Q = O_Q + A_Q \sin[(\omega_C - \omega_{LO})t + \theta - \phi/2] \quad (5)$$

Input of these uncorrected signals with offset, gain and phase errors into a standard demodulator results in substantially degraded performance.

Offset Correction

Figure 1:
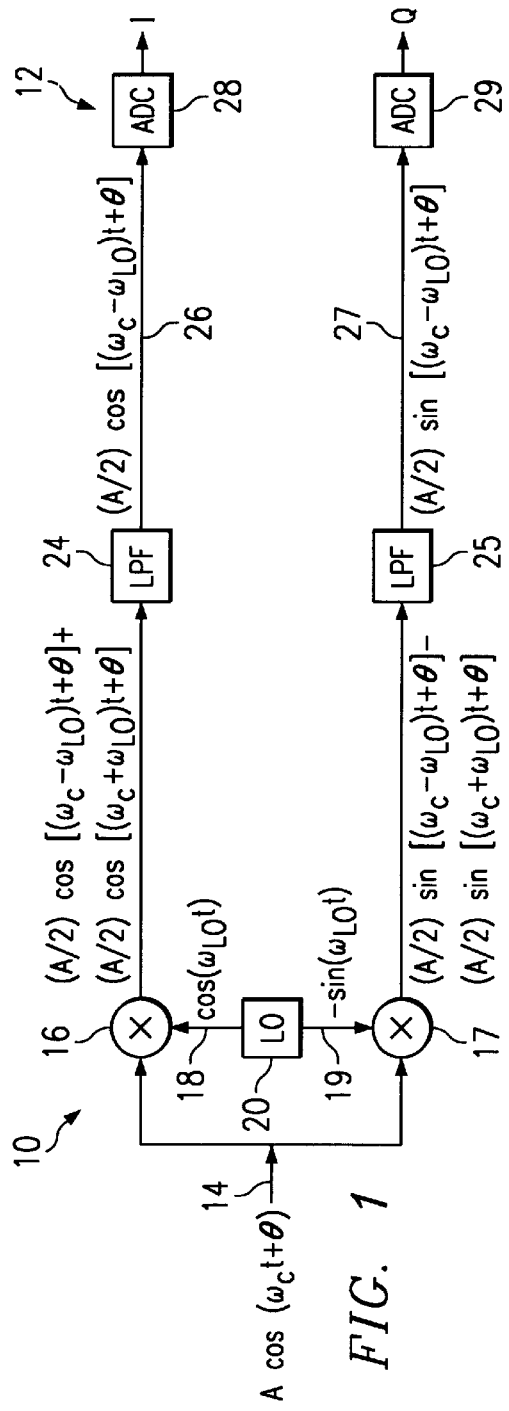
FIG. 1 is a functional block diagram of an ideal quadrature tuner and digitizer.
Figure 2:
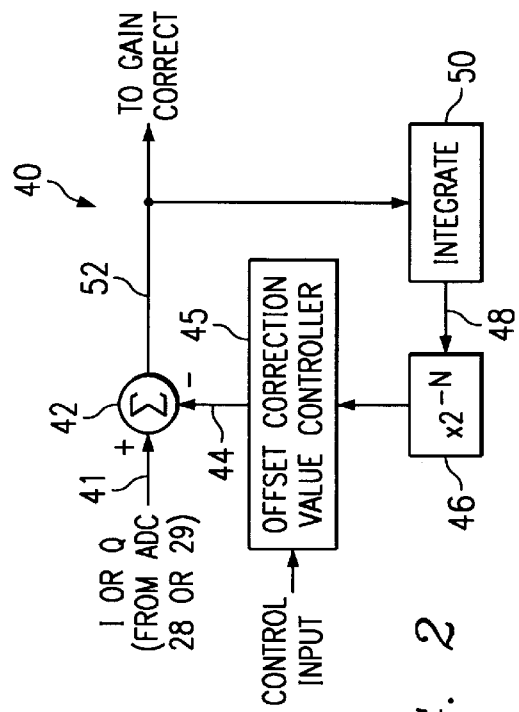
FIG. 2 is a functional block diagram of an embodiment of an offset correction circuit and algorithm constructed according to an embodiment of the present invention.

A functional block diagram of an embodiment of the digital offset correction circuit and algorithm 40 according to the present invention is shown in FIG. 2. The in-phase and quadrature signals may both be corrected for offset error with the circuit or algorithm shown in FIG. 2. A summer 42 receives the in-phase or quadrature signal from analog-to-digital converter 28 or 29 (FIG. 1) as input signal 41 and subtracts an offset estimate 44 from it. Offset estimate 44 is supplied by a multiplier 46, which in effect multiplies an input 48 thereto by a constant $2^{-N}$ Multiplier 46 is coupled to an integrator 50, which receives its input from the output of summer 42.

In operation, a near zero offset estimate 44 is first subtracted from the in-phase or quadrature signal input 42, and the resultant output 52 is integrated and fed back through multiplier 46 to form the offset estimate 44. Multiplier 46 maybe implemented by a shifter which shifts its input signal right N bits. This circuit and algorithm in essence implement a high pass filter with a cut-off frequency that can be made arbitrarily low by increasing N (and consequently the width of the integrator).

Offset correction circuit and algorithm of the present invention is adapted to function properly with no input signal or noise-only input. However, the circuit or algorithm may not function properly if an unmodulated carrier signal is applied to mixers 16 and 17 with frequency closely matching the frequency of local oscillator 20 (i.e. $\omega_C \approx \omega_{LO}$). This condition can be avoided by slightly off-tuning local oscillator 20 from the expected range of input frequencies.

In an embodiment of the present invention, an offset correction value controller 45 such as a symmetric limiter as known in the art may be incorporated at the output of multiplier 46 to limit the range of offset correction values if needed.

In an embodiment of the present invention, offset correction value controller 45 may include a correction register, multiplexer, processor and other components (not shown) to allow processor control of the value of offset correction 44 during certain operating conditions, such as temperature variation. The offset correction value may be computed or determined in response to a control input such as a temperature measurement.

Gain Correction

A functional block diagram of an embodiment of a gain correction circuit and algorithm 60 according to the present invention is shown in FIG. 3. Preferably, gain correction follows offset correction and uses, as input, the in-phase and quadrature output from offset correction circuit and algorithm 40 shown in FIG. 2. The offset corrected in-phase and quadrature signals 61 and 62 are provided to multipliers 63 and 64, respectively, to be multiplied by initial correction values (near 1). The resulting gain corrected output signals are each squared by a squaring network including squarers 66 and 67, and a difference between the squared values is determined by a summer 68. The difference result is then fed to an integrator 70 and multiplier 72 (shown implemented as a shifter). The output from multiplier 72 is provided as a gain correction signal to mixer 64 to be mixed with quadrature signal 62. The output from multiplier 72 is also supplied to mixer 63 to be mixed with in-phase signal 61 after it is inverted, as in $(\,)^{-1}$, by an inverter 74.

A feedback loop enable circuit 65 may be needed to disable the feedback loop when no signal or noise inputs are present. For example, feedback loop enable circuit may include a lowpass filter to detect the absence of signal or noise input or to compare the squarer output with a reference signal at the output of squarer 66. Only when the detected power output of the squarer exceeds the predetermined reference value, is the feedback loop enabled.

Preferably, gain correction follows offset correction, since an uncorrected offset value in the in-phase or quadrature signals may erroneously contribute to the squaring power measurement calculations. It may be desirable to disable the gain correction feedback loop until the offset correction loops have settled and stabilized.

An embodiment of the gain offset algorithm may include a gain correction value controller 73 such as a symmetric limiter coupled to the output of shifter 72 to limit the range of gain correction values. Gain correction value controller 73 may also include processor controlled calibration to account for control input such as operating temperature date.

The embodiment of gain correction multipliers 63 and 64 may take advantage of the limited range of the gain control values. Assume that the maximum allowable corrected error is ±0.1 dB. Correction of an overall (I/Q) gain imbalance of ±1 dB with a maximum error of ±0.1 dB requires I and Q multipliers 63 and 64 each having a maximum gain range of ±0.5 dB and setting error of ±0.05 dB. Given a logarithmic gain control signal and multiplier, settings of −0.45 dB in 0.1 dB steps (10 total) meet the requirement. A maximum gain of +0.5 dB corresponds to a maximum linear correction value of 1.059254, and a minimum gain of −0.5 dB corresponds to a minimum linear correction value of 0.944061.

The maximum input gain control value corresponds to a right shift of $-\log_2(0.059)=4.08$, or just over 4 bits. The maximum value of K is then just under 1/16. Assuming 3 magnitude bits and 1 sign bit (16 total steps) are adequate for representing the control value, the possible gain selections are shown in Table A below:

TABLE A

| Control Bits | Control Value | Gain = 1 + (val/128) | Gain (db) | Δ Gain, Prev. Value |
|---|---|---|---|---|
| 0111 | +7 | 1.054688 | 0.4625 | N/A |
| 0110 | +6 | 1.046875 | 0.3979 | 0.0646 |
| 0101 | +5 | 1.039063 | 0.3328 | 0.0651 |
| 0100 | +4 | 1.031250 | 0.2673 | 0.0655 |
| 0011 | +3 | 1.023438 | 0.2012 | 0.0661 |
| 0010 | +2 | 1.015625 | 0.1347 | 0.0665 |
| 0001 | +1 | 1.007813 | 0.0676 | 0.0671 |
| 0000 | 0 | 1.000000 | 0.0000 | 0.0676 |
| 1111 | −1 | 0.992188 | −0.0681 | 0.0681 |
| 1110 | −2 | 0.984375 | −0.1368 | 0.0687 |
| 1101 | −3 | 0.976563 | −0.2060 | 0.0692 |
| 1100 | −4 | 0.968750 | −0.2758 | 0.0698 |
| 1011 | −5 | 0.960938 | −0.3461 | 0.0703 |
| 1010 | −6 | 0.953125 | −0.4170 | 0.0709 |
| 1001 | −7 | 0.945313 | −0.4885 | 0.0715 |
| 1000 | −8 | 0.937500 | −0.5606 | 0.0721 |

The results show that the maximum gain setting of 0.4625 dB is less than the specified maximum of 0.5 dB. However, it is 0.5−0.4625=0.0375 dB from that level, which is within the ±0.05 dB error toleranice. The minimum gain setting of −0.5606 dB is just under the specified minimum of −0.5 dB. The worst case gain step due to resolution limits is 0.0721 dB. The worst case setting error due to resolution limitations is then ±0.721/2=±0.036 dB, which is within the specified limit of ±0.5 dB.

A functional block diagram of an embodiment of a circuit for efficiently implementing this linear range is shown in FIG. 4. Multiplier 80 is used to implement multipliers 63 and 64 in FIG. 3 and includes a multiplier 82 receiving a gain, K, and the in-phase or quadrature signal from offset correction circuitry. The output from multiplier 82 is supplied to a summer 84, which sums the in-phase or quadrature input and the output from multiplier 82.

Multiplier 80 may have a 4-bit two's complement control value input. The output of multiplier 80 is shifted right 7 bits (1/128) from the LSB (least significant bit) of the input in-phase or quadrature signal. Further multiplier logic reductions can be realized through truncation and/or rounding prior to the output, since the 6 or 7 multiplier output LSB's are normally not utilized by output summer 84.

The use of the multiplier 80 also allows the multiplicative inversion, $(\ )^{-1}$, of gain correction circuit shown in FIG. 3 to be replaced by an additive inversion (two's complement) function, which generally has less complexity.

Phase Correction

A complete phase correction loop requires phase error detection and phase error correction functions. Phase error detection is accomplished by multiplying the in-phase and quadrature signals. Following offset and gain correction, the equations for the in-phase and quadrature signals are:

$$I=A\ \cos[(\omega_C-\omega_{LO})t+\theta+\phi/2]$$

$$Q=A\ \sin[(\omega_C-\omega_{LO})t+\theta-\phi/2] \tag{6}$$

Multiplying the two signals together results in:

$$I\cdot Q=A\ \cos[(\omega_C-\omega_{LO})t+\theta+\phi/2]\cdot A\ \sin[(\omega_C-\omega_{LO})t+\theta-\phi/2]$$

$$I\cdot Q=(A^2/2)\sin[2\cdot(\omega_C-\omega_{LO})t+2\theta]-(A^2/2)\sin(\phi) \tag{7}$$

The first term has no DC component, and can be removed by a lowpass filter (or integrator), resulting in the phase error signal:

$$\text{Filtered } I\cdot Q=-(A^2/2)\sin(\phi) \tag{8}$$

The remaining unknown value is the amplitude of the input signal. The filtered output of the in-phase or quadrature squarer used to determine signal and/or noise presence for the gain correction algorithm is approximately $A^2/2$ when there is a sufficiently high input signal to noise ratio (SNR). Dividing the filtered I·Q signal by the filtered in-phase or quadrature squarer output results in a phase error detection signal that is approximately equal to $-\sin(\phi)$. Greater accuracy may be achieved by using a power estimate value generated by a coherent demodulator utilizing the corrected signals.

For every corresponding pair of in-phase and quadrature samples, the cosine and sine terms differ only in the $\phi/2$ term. The identical terms are represented by Θ to simplify the phase error correction equations. The equations for the offset and gain corrected in-phase and quadrature values are:

$$I=A\ \cos(\Theta+\phi/2)$$

$$Q=A\ \sin(\Theta-\phi/2) \tag{9}$$

Given the trigonometric identities:

$$\cos(\alpha+\beta)=\cos(\alpha)\cos(\beta)-\sin(\alpha)\sin(\beta)$$

$$\sin(\alpha-\beta)=\sin(\alpha)\cos(\beta)-\cos(\alpha)\sin(\beta) \tag{10}$$

Substituting Equations (10) into Equations (9) results in Equations (11):

$$I=A\ \cos(\Theta)\cos(\phi/2)-A\ \sin(\Theta)\sin(\phi/2)$$

$$Q=A\ \sin(\Theta)\cos(\phi/2)-A\ \cos(\Theta)\sin(\phi/2) \tag{11}$$

Solving Equations (11) for A cos Θ and A sin Θ results in:

$$A\ \cos(\Theta)=[I+A\ \sin(\Theta)\sin(\phi/2)]/\cos(\phi/2)$$

$$A\ \sin(\Theta)=[Q+A\ \cos(\Theta)\sin(\phi/2)]/\cos(\phi/2) \tag{12}$$

Substituting Equations (12) into Equations (11) results in:

$$I=A\ \cos(\Theta)\cos(\phi/2)-[Q+A\ \cos(\Theta)\sin(\phi/2)]\sin(\phi/2)/\cos(\phi/2)$$

$$Q=A\ \sin(\Theta)\cos(\phi/2)-[I+A\ \sin(\Theta)\sin(\phi/2)]\sin(\phi/2)/\cos(\phi/2) \tag{13}$$

Expanding Equations (13) and using the relationship tan $(\phi/2)=\sin(\phi/2)/\cos(\phi/2)$ results in:

$$I=A\ \cos(\Theta)\cos(\phi/2)-Q\ \tan(\phi/2)-A\ \cos(\Theta)\sin(\phi/2)\tan(\phi/2)$$

$$Q=A\ \sin(\Theta)\cos(\phi/2)-I\ \tan(\phi/2)-A\ \sin(\Theta)\sin(\phi/2)\tan(\phi/2) \tag{14}$$

Rearranging Equations (14) results in:

$$A\ \cos(\Theta)\cos(\phi/2)-A\ \cos(\Theta)\sin(\phi/2)\tan(\phi/2)=I+Q\ \tan(\phi/2)$$

$$A\ \sin(\Theta)\cos(\phi/2)-A\ \sin(\Theta)\sin(\phi/2)\tan(\phi/2)=Q+I\ \tan(\phi/2) \tag{15}$$

Isolating A cos Θ and A sin Θ in Equations (15) results in:

$$A\cos(\Theta)=[I+Q\tan(\phi/2)]/[\cos(\phi/2)-\sin(\phi/2)\tan(\phi/2)]$$

$$A\sin(\Theta)=[Q+I\tan(\phi/2)]/[\cos(\phi/2)-\sin(\phi/2)\tan(\phi/2)] \quad (16)$$

The left hand sides of Equations (17) are defined as the corrected in-phase and quadrature values I and Q:

$$I=A\cos(\Theta)=[I+Q\tan(\phi/2)]/[\cos(\phi/2)-\sin(\phi/2)\tan(\phi/2)]$$

$$Q=A\sin(\Theta)=[Q+I\tan(\phi/2)]/[\cos(\phi/2)-\sin(\phi/2)\tan(\phi/2)] \quad (17)$$

The denominators of both expressions in Equations (17) are identical, so the in-phase and quadrature gains are the same if neither are calculated. The maximum denominator value is 1 when $\phi=0°$, and the minimum value is 0.997144 when $\phi$ is 5°, for a maximum signal power effect of 0.025 dB. The denominator value only needs to be calculated if extremely accurate carrier power measurements are needed. Removing the denominators results in the final correction equations:

$$I=A\cos(\Theta)=[I+Q\tan(\phi/2)]$$

$$Q=A\sin(\Theta)=[Q+I\tan(\phi/2)] \quad (18)$$

Figure 5:
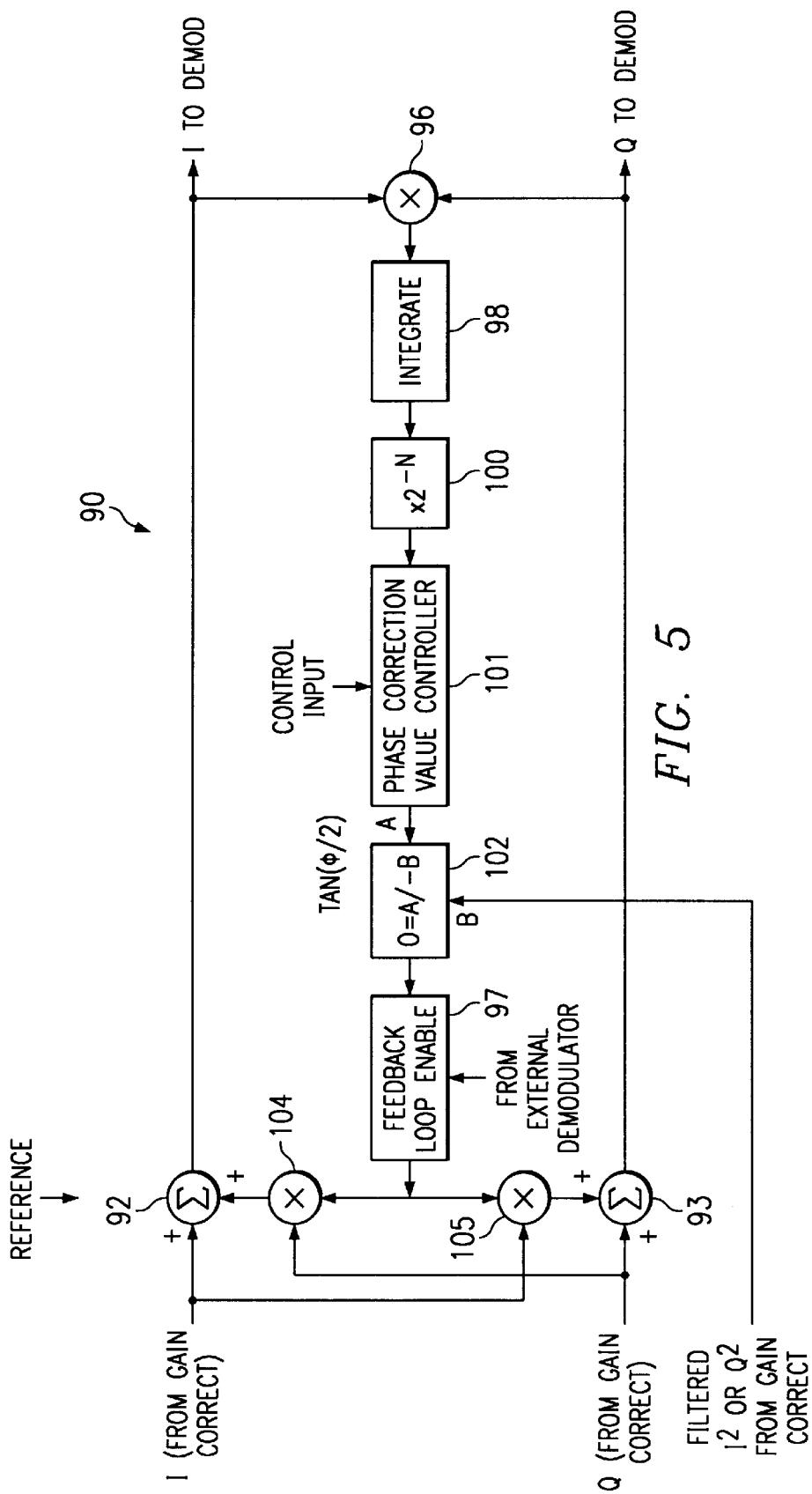
FIG. 5 is a functional block diagram of an embodiment of a phase correction circuit and algorithm constructed according to an embodiment of the present invention.

A functional block diagram of an embodiment of a phase correction circuit and algorithm 90 of the present invention is shown in FIG. 5. Circuit and algorithm 90 include summers 92 and 93 receiving the in-phase and quadrature signals, respectively, which already have been corrected for offset and gain errors. Summers 92 and 93 are coupled to the inputs of a multiplier 96, the output is coupled to an integrator 98. Integrator 98 is coupled to a multiplier implemented by a shifter 100, and the output is supplied to a circuit block 102 which divides the shifter output by −1 and multiplies it by the $I^2$ or $Q^2$ value from squarer 66 or 67 and passed through a lowpass filter from gain correction circuit 60 shown in FIG. 3. The output from block 102 is an estimate of $\tan(\phi/2)$, and is provided to both multipliers 104 and 105, which also receives the quadrature or in-phase input signals, respectively. The output of multipliers 104 and 105 are coupled to summers 92 and 93, respectively.

In operation, the in-phase and quadrature inputs are both multiplied by the estimate of $\tan(\phi/2)$ at multipliers 104 and 105, and the result is summed with the other input to form the corrected in-phase and quadrature values. The corrected outputs are multiplied together at multiplier 96 to detect the phase error, and the resulting signal is integrated and shifted. The shifter output is divided by minus 1 times the filtered $I^2$ or $Q^2$ output from the gain correction algorithm, resulting in the estimate of $\tan(\phi/2)$.

Since the loop bandwidth is narrow, divider 102 may be operated at a lower sample rate than the signal paths, allowing a low complexity serial divider to be used in implementation.

The phase correction algorithm of the present invention may not function properly when no signal input is present. The presence of an input signal may be detected by a feedback loop enable circuit 97 shown coupled to the output of multiplier 96, for example. The phase correction loop may be disabled until an input signal is detected. Feedback loop enable circuit 97 may also be used to disable the phase correction loop until the gain correction loop has stabilized and produces errors less than a predetermined threshold, for example.

Preferably, phase correction follows gain correction, since the amplitude values are assumed to be equal in derivation.

In implementation, it may be desirable to couple a phase correction value controller 101, such as a symmetric limiter, at the output of shifter 100 to limit the range of phase correction values. Processor controlled calibration may be added to this circuit to compensate for temperature variation using an approach similar to those described above for offset and gain correction.

The implementation of the phase correction multipliers may take advantage of the limited range of the $\tan(\phi/2)$ value. Assume that the maximum allowable corrected error is ±0.2°. Correction of a maximum phase range of ±5° and setting error of ±0.2° requires phase correction multipliers having a maximum gain of $\pm\tan(2.5°)$ and setting error of $\pm\tan(0.1°)$. Given a tangent-linear control signal and multiplier, settings of $-\tan(2.4°$ degrees) to $\pm\tan(2.4°$ degrees) in 0.20 degree steps (25 total) meet the requirement.

A maximum phase error of +5° corresponds to a maximum linear correction value of $\tan(+2.5°)=+0.043661$, and a minimum phase error of −5° corresponds to a minimum linear correction value of $\tan(-2.5°)=-0.043661$. The maximum input control value corresponds to a right shift of $-\log_2(0.043661)=4.52$, or over 4 bits. The maximum value of $\tan(\phi/2)$ is then less than 1/16. Assuming four magnitude bits and one sign bit (32 total steps) are adequate for representing the control value, some possible multiplication factors are shown in Table B below

TABLE B

| Control Bits | Control Value | Factor = Value/256 | $\tan^{-1}$ (Factor), deg. | Δ Deg., Prev. $\tan^{-1}$ |
| --- | --- | --- | --- | --- |
| 01100 | +12 | +0.046875 | +2.6838 | N/A |
| 01011 | +11 | +0.042969 | +2.4604 | 0.2234 |
| 01010 | +10 | +0.039063 | +2.2370 | 0.2234 |
| 01001 | +9 | +0.035156 | +2.0135 | 0.2235 |
| — | — | — | — | — |
| 00010 | +2 | +0.007813 | +0.4476 | N/A |
| 00001 | +1 | +0.003906 | +0.2238 | 0.2238 |
| 00000 | 0 | 0.000000 | 0.0000 | 0.2238 |
| 11111 | −1 | −0.003906 | −0.2238 | 0.2238 |
| 11110 | −2 | −0.007813 | −0.4476 | 0.2238 |
| — | — | — | — | — |
| 10111 | −9 | −0.035156 | −2.0135 | N/A |
| 10110 | −10 | −0.039063 | −2.2370 | 0.2235 |
| 10101 | −11 | −0.042969 | −2.4604 | 0.2234 |
| 10100 | −12 | −0.046875 | −2.6838 | 0.2234 |

The results show that the required range can be met with control settings of +12 to −12, well within the five-bit range of +15 to −16. The worst case phase step due to resolution limits is 0.2238°. The worst case setting error due to resolution limitations is then ±0.2238/2=±0.1119°, which is just over the specified limit of ±0.1°.

Phase correction multipliers 104 and 105 may have a five-bit two's complement control value inputs. The outputs of the multipliers are shifted right 8 bits (1/256) from the LSB of the input signal. Further multiplier logic reductions can be realized through truncation and/or rounding prior to the output, since several of the multiplier output LSBs may not be utilized by correction summers 92 and 93.

Simulation of phase correction circuit and algorithm 90 showed that worst case theoretical performance may be achieved with a correction signal from multipliers 104 and 105 having higher resolution than the input signal. A signal-to-noise ratio of at least the minimum theoretical value of 43.9 dB is not achieved until a correction value quantization of 1/4 input LSB is reached.

Simulation also shows that $\tan(\phi/2)$ must be quantized to at least rnd(tan*256)/256 to achieve a signal-to-noise ratio that is at least the minimum theoretical value of 43.9 dB. The maximum value of rnd($\tan(\phi/2)$*256) is 12 for $\phi=5°$, indicating that a five-bit two's complement value may be used to represent both positive and negative values of tan(φ/2).

It may be advantageous to note that the description set forth above is directed to the functional aspects of the various circuit blocks and the algorithm used to accomplish the error correction. Therefore, the present invention is not limited to any specific implementation of the functional blocks or the algorithms.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A correction circuit for quadrature tuner error correction, the correction circuit receiving a digital in-phase signal and a digital quadrature signal from a quadrature tuner, the correction circuit comprising:
    an in-phase summer receiving the digital in-phase signal and an in-phase offset estimate, and subtracting the in-phase offset estimate from the in-phase signal, and generating an offset corrected in-phase signal;
    an in-phase feedback loop responsive to the output of the in-phase summer and adapted to generate the in-phase offset estimate, the in-phase feedback loop further comprising an offset correction value controller receiving a control input and operable to control levels of the in-phase offset estimate;
    a quadrature summer receiving the digital quadrature signal and a quadrature offset estimate, and subtracting the quadrature offset estimate from the digital quadrature signal, and generating an offset corrected quadrature signal; and
    a quadrature feedback loop responsive to the output of the quadrature summer and adapted to generate the quadrature offset estimate, the quadrature feedback loop, further comprising an offset correction controller receiving a control input and operable to control levels of the quadrature offset estimate.

2. The correction circuit, as set forth in claim 1, wherein the in-phase feedback loop and quadrature feedback loop each comprises an integrator coupled to the output of the respective summer and receiving the offset corrected in-phase or quadrature signal and operable to integrate the offset corrected in-phase or quadrature signal.

3. The correction circuit, as set forth in claim 2, wherein the in-phase feedback loop and the quadrature feedback loop each comprises a shifter coupled to the integrator and receiving the integrated offset corrected in-phase or quadrature signal as an input and operable to right shift the input N bits to generate the in-phase or quadrature offset estimate.

4. The correction circuit, as set forth in claim 1, further comprising a gain correction circuit adapted to receive the offset corrected in-phase signal and the offset corrected quadrature signal, the gain correction circuit comprising:
    a first multiplier receiving the offset corrected in-phase signal for multiplication with an inverse of a gain correction estimate, and generating a gain correction in-phase signal;
    a second multiplier receiving the offset corrected quadrature signal for multiplication with the gain correction estimate, and generating a gain corrected quadrature signal; and
    a feedback loop comprising:
        a squaring network coupled to the first and second multipliers for receiving and squaring the gain corrected in-phase and quadrature signals;
        a summer coupled to receive signals from the squaring network to subtract the squared quadrature signal from the squared in-phase signal, and generating a difference signal;
        an integrator coupled to receive the difference signal from the summer to integrate the difference signal; and
        a shifter coupled to the integrator to receive the integrated difference signal, multiply the integrated difference signal by an adjustable constant, and generate the gain correction estimate.

5. The correction circuit, as set forth in claim 4, wherein the feedback loop of the gain correction circuit further comprises a feedback loop enable circuit coupled to the shifter and operable to enable the feedback loop for predetermined condition.

6. The correction circuit, as set forth in claim 4, wherein the first and second multipliers of the gain correction circuit each comprises:
    a multiplier receiving the offset corrected in-phase or quadrature signal for multiplication by a value within a predetermined range, and generating an output; and
    a summer coupled to the multiplier and receiving the output therefrom for summing with the offset corrected in-phase or quadrature signal.

7. The correction circuit, as set forth in claim 4, further comprising a phase correction circuit adapted to receive the gain corrected in-phase signal and the gain corrected quadrature signal, the phase correction circuit comprising:
    a first multiplier receiving and multiplying the gain corrected quadrature signal with a phase correction factor to generate an in-phase correction signal;
    a second multiplier receiving and multiplying the gain corrected in-phase signal with the phase correction factor to generate a quadrature phase correction signal;
    a first summer coupled to receive the gain corrected in-phase signal and the in-phase phase correction signal from the first multiplier to generate a phase corrected in-phase signal output;
    a second summer coupled to receive the gain corrected quadrature signal and the quadrature phase correction signal from the second multiplier to generate a phase corrected quadrature signal output; and
    a phase correction feedback loop comprising:
        a third multiplier coupled to the first and second summers and adapted to multiply the phase corrected in-phase signal output and the phase corrected quadrature signal output to generate a phase error signal;
        an integrator coupled to the third multiplier and adapted to integrate the phase error signal;
        a shifter coupled to the integrator and adapted to multiply the integrated phase error signal by an adjustable constant to generate a shifted phase error signal; and
        a circuit coupled to the shifter and adapted to receive the shifted phase error signal, and divide the phase error signal by −1 and multiply the phase error signal by a lowpass filtered squared signal from the gain correction circuit, and generate the phase correction factor.

8. The correction circuit, as set forth in claim 7, wherein the phase correction factor comprises tan(φ/2), where φ is the estimated phase error.

9. The correction circuit, as set forth in claim 7, wherein the phase correction feedback loop further comprises a phase correction feedback loop enable circuit operable to enable the phase correction feedback loop of the phase correction circuit in response to the presence of input signals to the first and second summers.

10. The correction circuit, as set forth in claim 7, wherein the phase correction feedback loop further comprises a phase correction feedback loop enable circuit adapted to enable the phase correction feedback loop in response to the detection of stable functioning of the gain correction circuit.

11. The correction circuit, as set forth in claim 7, wherein the first and second multipliers of the phase correction circuit each comprises:

a multiplier receiving the gain corrected in-phase or quadrature signal, multiplying the received signal by a value within a predetermined range, and generating an output; and a summer coupled to the multiplier and receiving the output therefrom for summation with the gain corrected in-phase or quadrature signal.

12. A method for correcting tuner quadrature errors, comprising:

generating the in-phase offset estimate;

receiving a digital in-phase signal, subtracting the in-phase offset estimate from the in-phase signal, and generating an offset corrected in-phase signal;

integrating the offset corrected in-phase signal;

multiplying the integrated offset corrected in-phase signal by a first adjustable constant to generate the in-phase offset estimate;

generating the quadrature offset estimate;

receiving a digital quadrature signal, subtracting the quadrature offset estimate from the quadrature signal, and generating an offset corrected quadrature signal;

integrating the offset corrected quadrature signal; and multiplying the integrated offset corrected quadrature signal by a second adjustable constant to generate the quadrature offset estimate.

13. The method, as set forth in claim 12, wherein generating the offset estimates, comprises:

right shifting the integrated offset corrected signal N bits and generating the in-phase or quadrature offset estimate.

14. The method, as set forth in claim 12, further comprising high pass filtering the in-phase and quadrature signal, respectively, with an adjustable cut-off frequency.

15. The method, as set forth in claim 12, further comprising limiting the range of values of the in-phase or quadrature offset estimate.

16. The method, as set forth in claim 12, further comprising:

receiving the offset corrected in-phase signal, multiplying the offset corrected in-phase signal with an inverse of a gain correction estimate, and generating a gain corrected in-phase signal;

receiving the offset corrected quadrature signal, multiplying the offset corrected quadrature signal with the gain correction estimate, and generating a gain corrected quadrature signal;

squaring the gain corrected in-phase signal;

squaring the gain corrected quadrature signal;

subtracting the squared quadrature signal from the squared in-phase signal and generating a difference signal;

integrating the difference signal; and multiplying the integrated difference signal by an adjustable constant to generate the gain correction estimate.

17. The method, as set forth in claim 16, further comprising:

detecting the presence of offset corrected in-phase and quadrature signals; and enabling the gain correction in response to detecting the signals.

18. The method, as set forth in claim 16, further comprising:

lowpass filtering the offset corrected in-phase signal;

generating an absolute value of the lowpass filtered offset corrected in-phase signal;

comparing the absolute value of the lowpass filtered offset corrected in-phase signal with a predetermined maximum offset value;

lowpass filtering the offset corrected quadrature signal;

generating an absolute value of the lowpass filtered offset corrected quadrature signal;

comparing an abolute value of the lowpass filtered offset corrected quadrature signal with the predetermined maximum offset value; and enabling the gain correction in response to the absolute values both being less than the predetermined maximum offset value.

19. The method, as set forth in claim 16, wherein multiplying offset corrected in-phase and quadrature signals by the gain correction estimate each comprises:

multiply the offset corrected in-phase signal or the offset corrected quadrature signal by a value within a predetermined range, and generating an output; and summing the output with the offset corrected in-phase or quadrature signal.

20. The method, as set forth in claim 16, further comprising:

multiplying the gain corrected quadrature signal with a phase correction factor, and generating an in-phase correction signal;

multiplying the gain corrected in-phase signal with the phase correction factor and generating a quadrature phase correction signal;

summing the gain corrected in-phase signal and the in-phase phase correction signal and generating a phase corrected in-phase signal output;

summing the gain corrected quadrature signal and the quadrature phase correction signal and generating a phase corrected quadrature signal output;

multiplying the phase corrected in-phase signal output and the phase corrected quadrature signal output, and generating a phase error signal;

integrating the phase error signal;

multiplying the integrated phase error signal by an adjustable constant, and generating a shifted phase error signal; and dividing the shifted phase error signal by −1 and multiplying by a lowpass filtered and squared signal from the gain correction, and generating the phase correction factor.

21. The method, as set forth in claim 20, wherein the phase correction determines:

$$I=I+Q \tan(\phi/2)$$

$$Q=Q+I \tan(\phi/2)$$

where $\phi$ is the phase correction factor.

22. The method, as set forth in claim 20, further comprising generating an enable signal in response to the presence of input signals, the enable signal utilized to enable phase correction.

23. The method, as set forth in claim 20, wherein multiplying of the gain corrected quadrature signal with the phase correction factor and the multiplying of the gain corrected in-phase signal with the phase correction factor each comprises:
   multiplying gain corrected in-phase or quadrature signals by a value within a predetermined range, and generating an output; and
   summing the output with the gain corrected in-phase or quadrature signal.

24. Apparatus for quadrature tuner error correction comprising:
   an offset correction circuit adapted to receive a digital in-phase signal and a digital quadrature signal from a quadrature tuner, and generating offset corrected in-phase and quadrature signals;
   a gain correction circuit coupled to the offset correction circuit adapted to receive the offset corrected in-phase and quadrature signals and generating offset and gain corrected in-phase and quadrature signals; and
   a phase correction process coupled to the gain correction circuit adapted to receive the gain corrected in-phase and quadrature signals and generating offset, gain and phase corrected in-phase and quadrature signals.

25. Apparatus for quadrature tuner error correction comprising:
   an offset correction circuit comprising:
      an in-phase summer receiving the digital in-phase signal and an in-phase offset estimate, and subtracting the in-phase offset estimate from the in-phase signal, and generating an offset corrected in-phase signal;
      an in-phase feedback loop responsive to the output of the in-phase summer and adapted to generate the in-phase offset estimate;
      a quadrature summer receiving the digital quadrature signal and a quadrature offset estimate, and subtracting the quadrature offset estimate from the digital quadrature signal, and generating an offset corrected quadrature signal; and
      a quadrature feedback loop responsive to the output of the quadrature summer and adapted to generate the quadrature offset estimate;
   a gain correction circuit coupled to the offset correction circuit adapted to receive the offset corrected in-phase and quadrature signals and generating offset and gain corrected in-phase and quadrature signals; and
   a phase correction circuit coupled to the gain correction circuit adapted to receive the gain corrected in-phase and quadrature signals and generating offset, gain and phase corrected in-phase and quadrature signals.

26. The apparatus as set forth in claim 25, wherein the in-phase feedback loop and quadrature feedback loop each comprises an integrator coupled to the output of the respective summer and receiving the offset corrected in-phase or quadrature signal and operable to integrate the offset corrected in-phase or quadrature signal.

27. The apparatus as set forth in claim 26, wherein the in-phase feedback loop and the quadrature feedback loop each comprises a shifter coupled to the integrator and receiving the integrated offset corrected in-phase or quadrature signal as an input and operable to right shift the input N bits to generate the in-phase or quadrature offset estimate.

28. The apparatus as set forth in claim 25, wherein the in-phase feedback loop and the quadrature feedback loop each further comprises an offset correction value controller coupled to receive a control input, and operable to control levels of the in-phase and quadrature offset estimates.

29. Apparatus for quadrature tuner error correction comprising:
   an offset correction circuit adapted to receive a digital in-phase signal and a digital quadrature signal from a quadrature tuner, and generating offset corrected in-phase and quadrature signals;
   a gain correction circuit coupled to the offset correction circuit adapted to receive the offset corrected in-phase and quadrature signals, the gain correction circuit comprising:
      a first multiplier receiving the offset corrected in-phase signal for multiplication with an inverse of a gain correction estimate, and generating a gain correction in-phase signal;
      a second multiplier receiving the offset corrected quadrature signal for multiplication with the gain correction estimate, and generating a gain corrected quadrature signal; and
      a feedback loop comprising:
         a squaring network coupled to the first and second multipliers for receiving and squaring the gain corrected in-phase and quadrature signals;
         a summer coupled to receive signals from the squaring network to subtract the squared quadrature signal from the squared in-phase signal, and generating a difference signal;
         an integrator coupled to receive the difference signal from the summer to integrate the difference signal; and
         a shifter coupled to the integrator to receive the integrated difference signal, multiply the integrated difference signal by an adjustable constant, and generate the gain correction estimate; and
   a phase correction circuit coupled to the gain correction circuit adapted to receive the gain corrected in-phase and quadrature signals and generating offset, gain and phase corrected in-phase and quadrature signals.

30. The apparatus as set forth in claim 29, wherein the feedback loop of the gain correction circuit further comprises a feedback loop enable circuit coupled to the shifter and operable to enable the feedback loop for predetermined condition.

31. The apparatus as set forth in claim 29, wherein the first and second multipliers of the gain correction circuit each comprises:
   a multiplier receiving the offset corrected in-phase or quadrature signal for multiplication by a value within a predetermined range, and generating an output; and
   a summmer coupled to the multiplier and receiving the output therefrom for summing with the offset corrected in-phase or quadrature signal.

32. Apparatus for quadrature tuner error correction comprising:
- an offset correction circuit adapted to receive a digital in-phase signal and a digital quadrature signal from a quadrature tuner, and generating offset corrected in-phase and quadrature signals;
- a gain correction circuit coupled to the offset correction circuit adapted to receive the offset corrected in-phase and quadrature signals and generating offset and gain corrected in-phase and quadrature signals; and
- a phase correction circuit coupled to the gain correction circuit adapted to receive the gain corrected in-phase and quadrature signals and generating offset, gain and phase corrected in-phase and quadrature signals, the phase correction circuit comprising:
  - a first multiplier receiving and multiplying the gain corrected quadrature signal with a phase correction factor to generate an in-phase correction signal;
  - a second multiplier receiving and multiplying the gain corrected in-phase signal with the phase correction factor to generate a quadrature phase correction signal;
  - a first summer coupled to receive the gain corrected in-phase signal and the in-phase phase correction signal from the first multiplier to generate a phase corrected in-phase signal output;
  - a second summer coupled to receive the gain corrected quadrature signal and the quadrature phase correction signal from the second multiplier to generate a phase corrected quadrature signal output; and
  - a phase correction feedback loop comprising:
    - a third multiplier coupled to the first and second summers and adapted to multiply the phase corrected in-phase signal output and the phase corrected quadrature signal output to generate a phase error signal;
    - an integrator coupled to the third multiplier and adapted to integrate the phase error signal;
    - a shifter coupled to the integrator and adapted to multiply the integrated phase error signal by an adjustable constant to generate a shifted phase error signal; and
    - a circuit coupled to the shifter and adapted to receive the shifted phase error signal, and divide the phase error signal by −1 and multiply the phase error signal by a lowpass filtered squared signal from the gain correction circuit, and generate the phase correction factor.

33. The apparatus as set forth in claim 32, wherein the phase correction factor comprises $\tan(\phi/2)$, where $\phi$ is the estimated phase error.

34. The apparatus as set forth in claim 32, wherein the phase correction feedback loop further comprises a phase correction feedback loop enable circuit operable to enable the phase correction feedback loop of the phase correction circuit in response to the presence of input signals to the first and second summers.

35. The apparatus as set forth in claim 32, wherein the phase correction feedback loop further comprises a phase correction feedback loop enable circuit adapted to enable the phase correction feedback loop in response to the detection of stable functioning of the gain correction circuit.

36. The apparatus as set forth in claim 32, wherein the first and second multipliers of the phase correction circuit each comprises:
- a multiplier receiving the gain corrected in-phase or quadrature signal, multiplying the received signal by a value within a predetermined range, and generating an output; and
- a summer coupled to the multiplier and receiving the output therefrom for summation with the gain corrected in-phase or quadrature signal.

* * * * *

UNITED STATES PATENT AND TRADEMARK OFFICE
CERTIFICATE OF CORRECTION

PATENT NO. : 6,661,852 B1
DATED : December 9, 2003
INVENTOR(S) : Thad J. Genrich It is certified that error appears in the above-identified patent and that said Letters Patent is hereby corrected as shown below:

Column 8,
Line 24, after "Table B below", insert a colon.

Column 9,
Line 20, change "tuner, the correction circuit comprising:" to -- tuner, an offset circuit comprising: --.

Column 12,
Line 25, change "comparing an abolute value" to -- comparing an absolute value --;
Line 35, change "multiply the offset" to -- multiplying the offset --.

Signed and Sealed this

Seventh Day of September, 2004

JON W. DUDAS
*Director of the United States Patent and Trademark Office*